United States Patent
Høyerby

(10) Patent No.: US 10,110,120 B2
(45) Date of Patent: Oct. 23, 2018

(54) LOAD ADAPTABLE BOOST DC-DC POWER CONVERTER

(71) Applicant: Infineon Technologies Austria AG, Villach (AT)

(72) Inventor: Mikkel Høyerby, Herlev (DK)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/586,936

(22) Filed: May 4, 2017

(65) Prior Publication Data

US 2017/0324321 A1 Nov. 9, 2017

(30) Foreign Application Priority Data

May 6, 2016 (EP) .................................... 16168606

(51) Int. Cl.
*H03F 3/04* (2006.01)
*H02M 3/07* (2006.01)
(Continued)

(52) U.S. Cl.
CPC ............ *H02M 3/07* (2013.01); *H02M 1/088* (2013.01); *H03F 1/0244* (2013.01); *H03F 3/183* (2013.01);
(Continued)

(58) Field of Classification Search
CPC ......... H02M 1/08; H02M 7/537; H03F 3/183; H03F 3/217; H03F 3/2171; H03F 3/2173;
(Continued)

(56) References Cited

U.S. PATENT DOCUMENTS 8,044,719 B2 * 10/2011 Norimatsu .............. H03F 3/217
330/251
8,289,082 B2 * 10/2012 Prohaska ............ H03F 3/45179
330/9

(Continued)

FOREIGN PATENT DOCUMENTS

WO  WO 2016/050645  4/2016

OTHER PUBLICATIONS

Extended European Search Report for Application No. 16168606.8, dated Nov. 29, 2016 (9 pages).

*Primary Examiner* — Khanh V Nguyen
(74) *Attorney, Agent, or Firm* — Murphy, Bilak & Homiller, PLLC

(57) ABSTRACT

A boost DC-DC power converter comprising a semiconductor switch arrangement comprising a plurality of series connected semiconductor switches. A first capacitor is connected between a first intermediate node of a first leg of the semiconductor switch arrangement and a second intermediate node of a second leg of the semiconductor switch arrangement. A control circuit is coupled to respective control terminals of the plurality of semiconductor switches. A load sensor is configured to detect a load current and/or a load voltage of a load circuit connectable to at least a first DC output voltage of the DC-DC power converter. The control circuit being further configured to adjusting one or more operational parameters of the boost DC-DC power converter based on the detected load current and/or load voltage.

20 Claims, 10 Drawing Sheets

(51) Int. Cl.
  *H02M 1/088* (2006.01)
  *H03F 1/02* (2006.01)
  *H03F 3/183* (2006.01)
  *H03F 3/217* (2006.01)
  *H02M 1/00* (2006.01)
  *H03F 1/30* (2006.01)

(52) U.S. Cl.
  CPC ..... *H03F 3/217* (2013.01); *H02M 2001/0009* (2013.01); *H03F 1/0211* (2013.01); *H03F 1/0277* (2013.01); *H03F 1/305* (2013.01); *H03F 2200/03* (2013.01); *H03F 2200/504* (2013.01)

(58) Field of Classification Search
  CPC ............. H03F 2200/432; H03F 1/0211; H03F 1/0227; H03F 1/0244; H04R 3/00
  USPC .................................. 330/251, 297
  See application file for complete search history.

(56) References Cited

U.S. PATENT DOCUMENTS

| | | | |
|---|---|---|---|
| 8,773,082 B2* | 7/2014 | Urakabe | H02M 3/158 323/225 |
| 8,803,491 B2* | 8/2014 | Kobayashi | H02M 3/158 323/225 |
| 9,007,042 B2* | 4/2015 | Okuda | H02M 3/158 323/271 |
| 9,602,020 B2* | 3/2017 | Kondo | H02M 1/32 |
| 2012/0126764 A1 | 5/2012 | Urakabe | |
| 2014/0152276 A1 | 6/2014 | Kobayashi | |
| 2015/0311865 A1 | 10/2015 | Lawson | |

* cited by examiner

LOAD ADAPTABLE BOOST DC-DC POWER CONVERTER

CROSS-REFERENCE TO RELATED APPLICATIONS

This application claims the benefit of European Patent Application Serial No. 16168606.8, filed May 6, 2016, which is incorporated herein by reference in its entirety.

FIELD OF THE INVENTION

The present invention relates in one aspect to a boost DC-DC power converter comprising a semiconductor switch arrangement comprising a plurality of series connected semiconductor switches. A first capacitor is connected between a first intermediate node of a first leg of the semiconductor switch arrangement and a second intermediate node of a second leg of the semiconductor switch arrangement. A control circuit is coupled to respective control terminals of the plurality of semiconductor switches. A load sensor is configured to detect a load current and/or a load voltage of a load circuit connectable to at least a first DC output voltage of the DC-DC power converter. The control circuit being further configured to adjusting one or more operational parameters of the boost DC-DC power converter based on the detected load current and/or load voltage.

BACKGROUND OF THE INVENTION

Single-output and multiple-output boost DC-DC power converters are known. However, there is a continuing need to improve power conversion efficiency of known boost DC-DC power converters for example to improve battery life-time of portable applications. It would be advantageous to provide a boost DC-DC power converter where operational parameters of the power converters such as switching frequency and duty cycle are adjustable in dependence of various load specific requirements for example load power, load voltage, load current or other parameters associated with operation of the load.

SUMMARY OF INVENTION

Various embodiments of the present invention provide highly power efficient boost type of DC-DC power converters configured to generate one, two or more separate DC output voltages with lower component count compared to prior art boost DC-DC power converters.

A first aspect of the invention relates to a boost DC-DC power converter comprising a semiconductor switch arrangement. The semiconductor switch arrangement comprises:

a first leg comprising N series connected semiconductor switches, where N is an integer larger than 1, for example 2, 3 or 4. A first end of the first leg is connected to a DC reference potential and a second end of the first leg is connected to a boost node. A second leg of the semiconductor switch arrangement comprises N series connected semiconductor switches where a first end of the second leg is connected to the boost node and a second end of the second leg connected to a first output node for supplying a first DC output voltage. The boost DC-DC power converter further comprises an inductor having a first end connected to the boost node and a second end connectable to a DC input voltage supply. A first capacitor is connected between a first intermediate node of the first leg and a second intermediate node of the second leg and a second capacitor is connected between the DC reference potential and the first output node. The boost DC-DC power converter further comprises a load sensor configured to detect at least one of a load current and a load voltage of a load circuit where the load circuit is connectable to at least the first DC output voltage. A control circuit is connected to respective control terminals of the semiconductor switches of the semiconductor switch arrangement and further configured to adjusting one or more operational parameters of the boost DC-DC power converter based on the at least one of the detected load current and load voltage.

The boost DC-DC power converter may be designed or configured to generate one or more additional and separate DC output voltage(s) in addition to the first DC output voltage as discussed in further detail below. The present boost DC-DC power converter may be viewed as possessing a hybrid converter topology mixing features and operational characteristics of charge pumps and switched mode boost DC-DC power converters leading to a novel and efficient power converter topology as explained in further detail below. In that context, the inductor acts as a traditional boost inductor under certain operational conditions and may therefore repeatedly be charged from the DC input voltage supply and discharged to the first or second capacitors. The first capacitor acts as a flying capacitor of a traditional charge pump circuit. The control circuit may therefore be configured to:

place the first capacitor and the second capacitor in series via the semiconductor switch arrangement in a discharge configuration and place the first capacitor and the second capacitor in parallel via the semiconductor switch arrangement in at least the first charge configuration.

Each of the N semiconductor switches of the first leg and each of the N semiconductor switches of the second leg of the semiconductor switch arrangement may for instance comprise one or more field effect transistors (FETs), bipolar junction transistors (BJTs), insulated gate bipolar transistors (IGBTs) or the like, or a combination thereof. The FETs may be either of an enhancement-mode type or of a depletion-mode type. One or more of the FETs could for instance comprise metal-oxide-semiconductor field-effect transistors (MOSFETs). In an embodiment of the boost DC-DC power converter, one or more of the semiconductor switches of the semiconductor switch arrangement comprise a MOSFET. In that case, the source of the MOSFET in question may act as the first end of that particular semiconductor switch, and the drain of the MOSFET may act as the second end of that particular semiconductor switch. The control circuit will be connected to a gate of the MOSFET to control a gate voltage or potential of the MOSFET in order to switch the MOSFET between its conducting state/on-state and its non-conducting state/off-state. Similarly, a particular semiconductor switch of the semiconductor switch arrangement may comprise an IGBT, preferably with a parallel diode. In that case, the emitter of that IGBT can act as the first end of that particular semiconductor switch, and the collector of that IGBT can act as the second end of that particular semiconductor switch. The control circuit will control that IGBT's gate potential in order to switch that IGBT between its conducting state and its non-conducting state. Some embodiments of the semiconductor switch arrangement may comprise a mixture of n-channel FETs and p-channel FETs depending on whether the semiconductor switch in question is placed in the first leg or the second leg. In other embodiments each of the N semiconductor switches of the first leg and each of the N semiconductor switches of the second leg comprises an n-channel MOSFET or an IGBT.

In some embodiments, the respective capacitances of the first and second capacitors lie between 1 nF and 10 µF. An inductance of the inductor may lie between 10 nH and 10 µH. The switching frequency of each of N semiconductor switches of the first leg, each of N semiconductor switches of the second leg, and where present each of the first and second further semiconductor switches (discussed below) of the semiconductor switch arrangement may be identical.

The control circuit is capable of adapting or tailoring power loss, or conversion efficiency, of the boost DC-DC power converter to current power consumption demands of a load circuit connected to the first output node for receipt of the first DC output voltage. The current power consumption demands of a load circuit may be represented or expressed by various circuit variables such as the load current and/or voltage. The load circuit may comprise a class D audio power amplifier such as a multilevel class D audio amplifier or a multilevel power inverter. The control circuit senses or detects at least one of the load current, the load voltage and, where the load comprises the class D audio amplifier, a level of an audio input signal, or an audio signal derived therefrom, of the class D audio amplifier as discussed in additional detail below with reference to the appended drawings. The control circuit may adaptively adjust respective values of the one or more operational parameters of the boost DC-DC power converter based on one or more of the detected load current, detected load voltage and detected audio signal level. Various types of operational parameters may be adjusted by the control circuit, but the operational parameters preferably comprises at least one of:

a switching frequency of the semiconductor switches of the semiconductor switch arrangement, a duty cycle, D, of the control signals of the semiconductor switches of the semiconductor switch arrangement;

a voltage level of the control signals of the semiconductor switches of the semiconductor switch arrangement;

an operational regime of the semiconductor switch arrangement, wherein said operational regime comprises a predetermined set of converter states;

and a parameter or state of a feedback regulating loop controlling a level of at least the first DC output voltage.

By adjusting the switching frequency of the semiconductor switches the control circuit may tailor the power delivery capability of the boost DC-DC power converter in a versatile and efficient manner to a changing power consumption of the load circuit over a wide range of load currents or powers. By adjusting the duty cycle, D, of the control signals of the semiconductor switches, the control circuit may tailor the DC output voltage level of the boost DC-DC power converter in a versatile and efficient manner to changing supply voltage demands of the load circuit over a wide range of load currents or power. In addition, or in the alternative, the voltage level of the control signals of the semiconductor switches of the semiconductor switch arrangement may be adjusted in response to the at least one of the detected load current and load voltage. A large voltage level of the control signals, e.g. gate voltages, of the semiconductor switches typically lowers on-resistance of the switches, but may increase parasitic switching losses such that an optimum balance may be determined by the control circuit for a particular load power as discussed in further detail below with reference to the appended drawings.

With respect to the adjustment of the switching frequency of the semiconductor switches, the control circuit may be configured to selecting a first switching frequency if the load power is smaller than a first power threshold; and selecting a second switching frequency if the load power exceeds the first power threshold. The second switching frequency is higher than the first switching frequency for example at least two times higher. The control circuit may be configured to select a relatively low switching frequency, e.g. below 25 kHz or below 10 kHz, of the semiconductor switches of the semiconductor switch arrangement under conditions where the load circuit draws a relatively small amount of power from the first DC output voltage. The relatively low switching frequency reduces power losses incurred by the switching activity of certain components of the converter such as the 2*N semiconductor switches of the semiconductor switch arrangement, the first and second capacitors and the inductor. In the opposite situation where the load circuit draws a relatively large amount of load current or power from the first DC output voltage, the control circuit may respond by selecting a relatively high switching frequency of the semiconductor switch arrangement, e.g. switching frequency of above 100 kHz or above 1 MHz. The relatively high switching frequency increases the output current, voltage and power delivery capability of the boost DC-DC power converter for the reasons discussed in detail below with reference to the appended drawings. Hence, enabling the power converter to track the power consumption demands of the load circuit. The skilled person will understand that even if the relatively high switching frequency leads to an increased power loss in the boost DC-DC power converter the power loss may still represent a small fraction of the total power delivered to the load circuit and therefore remain insignificant in a system perspective.

With respect to the adjustment of the operational regime of the semiconductor switch arrangement, the control circuit may be configured to select an operational regime of the semiconductor switch arrangement wherein the N series connected semiconductor switches of the second leg are placed in respective conducting states and the residual switches of the semiconductor switch arrangement arranged in respective non-conducting states, thereby energizing the first DC output voltage from the DC input voltage supply through the second leg. This regime may provide a direct current path from the DC input voltage supply to the first DC output voltage through the second leg thereby charging or energizing the second capacitor without any switching activity of the semiconductor switch arrangement. This may be advantageous in situations where the load power is relatively small and no need for a boosted voltage level on first DC output voltage relative to the DC input voltage. According to another embodiment, the predetermined set of converter states of the operational regime comprises:

a first charge configuration for charging the inductor through a first current path extending from the boost node to the DC reference potential; and a first discharge configuration for discharging the inductor through a second current path extending from the boost node either directly through the second leg to the first output node or through the first capacitor and at least one semiconductor switch of the first leg and one semiconductor switch of the second leg.

According to one such embodiment, the control circuit is further configured to set the duty cycle of each of the control signals of the semiconductor switches of the semiconductor switch arrangement to substantially 0.5. This setting of the switch duty cycle generates a DC voltage of first DC output voltage which is two times the DC input voltage as discussed in further detail below with reference to the appended drawings. In addition, the duty cycle D=0.5 leads to a minimum magnitude of ripple current in the boost inductor as discussed in further detail below with reference to the appended drawings. Hence, the control circuit may be further configured to detecting load power to the load circuit based at least on the detected load current, and optionally the load voltage, and adjusting the switching frequency of the semiconductor switch arrangement in accordance with the detected load power while maintaining D=0.5. This methodology provides a simple and conversion efficient way of adjusting and improving the power delivery capability of the present boost DC-DC power converter in response to increasing load power demands as discussed in further detail below with reference to the appended drawings.

The implementation and benefits of different operational regimes of the boost DC-DC power converter and associated sets of converter states and state switching schemes are described in detail in the applicant's co-pending application PCT/EP2015/072124 and will not be repeated in every detail here.

With respect to the adjustment of the parameter or state of the feedback regulating loop, the control circuit may be further configured to detecting load power to the load circuit based at least on the detected load current and adjusting a loop gain of the feedback regulation loop in accordance with the detected load power. The loop gain may for example be set to approximately zero, i.e. a deactivated state of the feedback loop, for a certain range of the load power or for a certain output voltage range of the first DC output voltage. The control circuit may be configured to selecting a first loop gain, e.g. approximately zero, if the detected load power is below a first power threshold and selecting a second loop gain if the detected load power exceeds the first power threshold. The first loop gain is smaller than the second loop gain. The second loop gain may be sufficiently large to accurately regulate or control the DC voltage level at the first DC output voltage despite load variations and variations of the voltage of the DC input voltage supply. The feedback regulation loop may be configured to minimize a difference between a target DC voltage and a signal representing the first DC output voltage or if present the second DC output voltage.

One embodiment of the boost DC-DC power converter is configured to generate two separate DC output voltages, i.e. a dual-output DC-DC power converter. The level of a lower DC output voltage of the two separate DC output voltages may be approximately one-half of the higher DC output voltage. This embodiment is useful for powering various types of multilevel class D audio amplifiers which may benefit from an accurate mid-supply DC voltage rail as input as discussed in further detail below with reference to the appended drawings. According to this embodiment, the semiconductor switch arrangement further comprises:

a first further semiconductor switch for selectively coupling or decoupling a second output node to a first end of the first capacitor, for supplying the second DC output voltage via a second output node and a second further semiconductor switch for selectively coupling or decoupling the second output node or, if present a third output node, to the second end of the first capacitor.

The load sensor may be configured for detecting the at least one of the load current and load voltage in various ways depending on the level of integration between the boost DC-DC power converter and the load circuit. In one embodiment, the load sensor may be operatively connected to a power supply line or rail of the load circuit such as a DC power supply line or ground supply line. Hence, in this embodiment, the load current may comprise a DC or AC current flowing through the power supply line of the load circuit and the load voltage may comprise a DC or AC voltage of the power supply line of the load circuit. Alternatively, the load sensor of the boost DC-DC power converter may be configured for detecting the at least one of the load current and load voltage internally in an appropriately arranged component or wiring of the power converter for example the first output node which supplies the first DC output voltage. Hence, the load current may comprise a DC or AC current flowing through at least the first DC output voltage and the load voltage may comprise a DC or AC voltage of at least the first DC output voltage.

A second aspect of the invention relates to an audio amplification system comprising a boost DC-DC power converter in accordance with any of the above disclosed embodiments thereof and an audio power amplifier. The audio power amplifier comprising at least a first DC supply voltage rail connected to the DC reference potential of the boost DC-DC power converter and a second DC supply voltage rail coupled to the first DC output voltage of the boost DC-DC power converter. The audio power amplifier may comprise a class D audio amplifier such as multilevel class D audio amplifier. The class D audio amplifier may be based on PDM modulation or PWM modulation of an audio input signal. One embodiment of the class D audio amplifier comprises an audio level detector configured to determine a level of an audio input signal, or an audio signal derived therefrom, of the class D audio amplifier and an audio level indicator configured to indicate the determined level of the audio input signal or audio signal derived therefrom. The boost DC-DC power converter of the audio amplification system may be configured to adjusting the one or more operational parameters based on at least one of the detected load current, the detected load voltage and the determined level of the audio input signal or the audio signal derived therefrom or any combination of the detected load current, detected load voltage and the determined level of the audio input signal or the audio signal derived therefrom.

BRIEF DESCRIPTION OF THE DRAWINGS

In the following embodiments of the invention are described with reference to the accompanying drawings, in which.

DETAILED DESCRIPTION OF THE INVENTION

Figure 1:
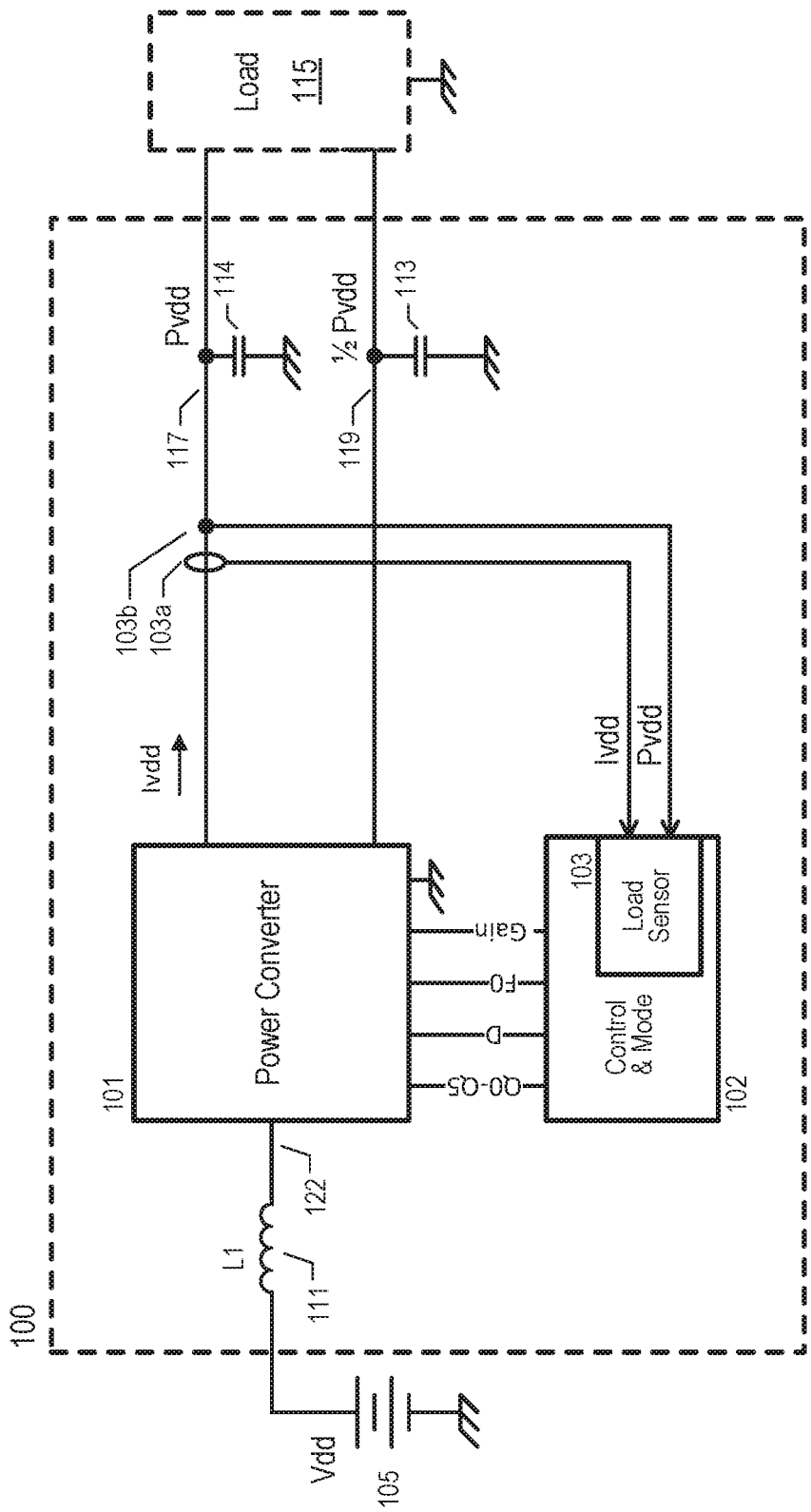
FIG. 1 illustrates a dual-output boost DC-DC power converter in accordance with a first embodiment of the invention.

In the following various exemplary embodiments of the boost DC-DC power converters are described with reference to the appended drawings. The skilled person will understand that the accompanying drawings are schematic and simplified for clarity and therefore merely show details which are essential to the understanding of the invention while other details have been left out. Like reference numerals refer to like elements throughout. Like elements will, thus, not necessarily be described in detail with respect to each figure.

FIG. 1 shows a block diagram of a dual-output boost DC-DC power converter 100 in accordance with a first embodiment of the invention. The dual-output boost DC-DC power converter 100 or power converter 100 comprises a converter circuit 101 and a control circuit 102 for controlling the operation of the power converter 100, in particular for adjusting one or more operational parameters of the power converter 100 based on a detected load current and/or detected load voltage as described in additional detail below. The converter circuit 101 comprises a semiconductor switch arrangement coupled to a floating charge capacitor as discussed in further detail with reference to FIG. 2 below. The power converter 100 is connected to an input power or input voltage supply 105 (Vdd) which supplies energy for the power converter 100. The power converter 100 is configured to generate separate first and second DC output voltages of different DC voltage levels, Pvdd and ½ Pvdd, respectively, in the present embodiment. The skilled person will understand that other embodiments of the power converter may be configured to generate merely a single DC output voltage, e.g. Pvdd, or more than two different DC output voltages in accordance with application requirements. A first smoothing capacitor 114 is preferably connected to the first DC output voltage and a second smoothing capacitor 113 is preferably connected to the second DC output voltage. The voltage level of the second DC output voltage is approximately on-half of the voltage level of the first DC output voltage as indicated by the factor 0.5. This feature is a noteworthy characteristic of the power converter circuit 100 enabled by the hybrid converter topology mixing operational characteristics of charge pumps and switched mode boost DC-DC power converters leading to a versatile and efficient power converter topology as explained in further detail below. The present embodiment of power converter 100 comprises an optional and programmable feedback voltage regulation loop (not shown) via the control circuit 102. The programmable feedback voltage regulation loop may in some embodiments of the invention be switched off or deactivated when certain values of the operational parameters of the power converter 100 are complied with. However, in its active state the programmable feedback voltage regulation loop provides accurate setting and continuous tracking of the respective DC output voltage levels of the first and second DC output voltages Pvdd and ½ Pvdd despite variations of the DC input voltage, load, temperature and circuit component values.

The power converter circuit 100 additionally comprises an inductor 111 having a first end connected to a boost node 122 and a second end connectable to a DC input voltage supply 105 (Vdd). The latter is schematically illustrated as a battery stack or package, but may comprise numerous types of DC voltage supplies available in an apparatus comprising the power converter 100 circuit.

The power converter circuit 100 is connected to a load circuit 115 via two different supply paths such that load voltage and load current, Ivdd, is supplied to the load circuit 115 as needed. The first DC output voltage (Pvdd) is connected to a first DC supply line or terminal of the load circuit 115 and the second DC output voltage (½ Pvdd) is connected to a second DC supply line or terminal of the load circuit 115. The load circuit 115 may comprise a class D audio power amplifier (not shown)—for example a multi-level class D audio amplifier, as discussed in further detail below with reference to FIG. 6. A DC voltage of the input voltage supply 105 may lie between 1.5 V and 5.0 such as about 3.6 V.

The control circuit 102 is connected to respective gate or control terminals of the semiconductor switches of the semiconductor switch arrangement of the converter circuit 101 as discussed in detail below with reference to FIG. 2. The control circuit 102 is configured to adjust one or more operational parameters of the power converter 100 based on a detected load current or detected load voltage or a combination of both, e.g. representing load power. In the present embodiment, the control circuit 102 senses the load current Ivdd by sensing the DC and AC current flowing through the power supply line or wire 117 of the first DC output voltage (Pvdd). The control circuit 102 furthermore senses the load voltage by sensing at least the first DC output voltage (Pvdd). The control circuit 102 may comprise a suitable sense circuit 103, 103a, 103b for sensing the load voltage and load current Pvdd, Ivdd. This sense circuit 103 may comprise a current sensor 103a, such as a small resistance, inserted in the power supply line or wire 117. The sensed or detected load voltage and load current Pvdd, Ivdd may be applied to suitable inputs of the control circuit 102. In some embodiments, the detected load voltage and load current Pvdd, Ivdd may be represented in digital format, or be converted to digital format, inside the control circuit 102 by an A/D converter and suitable conditioning circuitry (not shown). The control circuit 102 may furthermore be configured to sense the DC and AC current flowing through the power supply line or wire 119, applying the second DC output voltage (½ Pvdd) to the load circuit 115 in a similar manner.

In one embodiment of the power converter circuit 100, the control circuit 102 is configured to adjusting several operational parameters of the power converter based on at least one of the detected load current, voltage or power. The operational parameters comprise at least a switching frequency of the semiconductor switch arrangement and a duty cycle D of the control signals Q0-Q5 of the semiconductor switch arrangement. The operational parameters may additionally comprise a parameter of the feedback voltage regulating loop such as a loop gain or state, e.g. activated/on or deactivated/off. The one or more operational parameters may additionally comprise an operational regime of the semiconductor switch arrangement wherein said operational regime comprises a predetermined set of converter states. Various operational regimes of the semiconductor switch arrangement are discussed in further detail below.

The control circuit 102 is capable of adapting or tailoring power loss, or conversion efficiency, of the power converter 100 to the power consumption of the load circuit 115 by adaptively adjusting values of the one or more operational parameters of the power converter 100 based on the detected load current, voltage or power. The control circuit 102 may for example be configured to select a relatively low switching frequency of the semiconductor switch arrangement under conditions where the load circuit 115 draws a relatively small amount of power from the first DC output voltage and thereby reduce power losses incurred by the switching activity of certain components of the converter circuit 101. These components may comprise the semiconductor switches, capacitors and the inductor 111. In the opposite situation, where the load circuit 115 draws a relatively large amount of power from the first DC output voltage, the control circuit 102 may in response select a relatively high switching frequency of the semiconductor switch arrangement. The relatively high switching frequency increases the output current, voltage and power delivery capability of the power converter circuit 100. Hence, enabling the power converter 100 to meet the power consumption demands of the load circuit 115. Even if the high switching frequency leads to an increase of power losses of the power converter 100 these power losses may still represent a small fraction of the total power delivered to the load circuit and therefore insignificant from a system's perspective.

Figure 2:
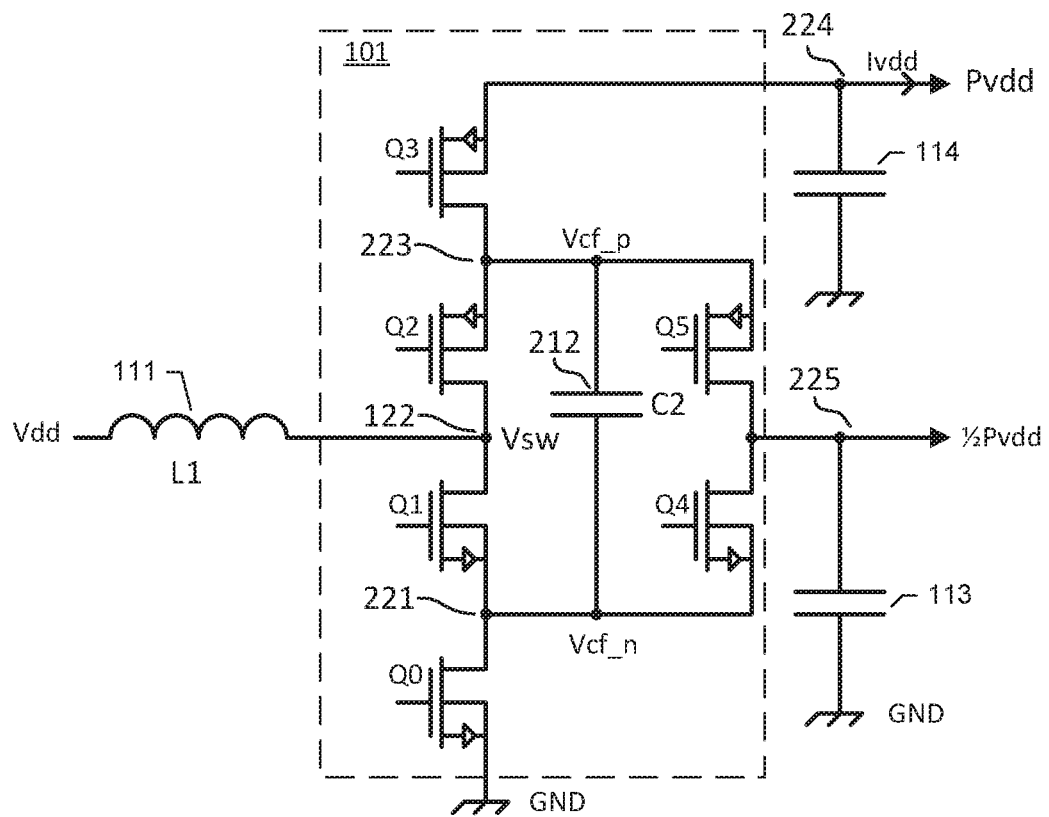
FIG. 2 illustrates a transistor level block diagram of a semiconductor switch arrangement of the dual-output boost DC-DC power converter circuit depicted on FIG. 1.

FIG. 2 illustrates an exemplary transistor level schematic of the converter circuit 101 depicted in a simplified schematic format on FIG. 1. The exemplary converter circuit 101 comprises a semiconductor switch arrangement comprising six controllable semiconductor switches Q0-Q5. Each of the controllable semiconductor switches Q0-Q5 may for example comprise a NMOS FET and/or PMOS FET transistor as indicated in the figure. The switches Q0, Q1 and Q4 are preferably n-type switches, and switches Q2, Q3 and Q5 are preferably p-type switches, for instance PMOSFETs. The selection of switch type is a matter of design and is something that would advantageously be selected in such a way as to optimize the circuit for its intended application, for example in terms of DC voltage levels and voltage polarities. The semiconductor switch arrangement comprises a first leg comprising the first and second semiconductor switches Q0, Q1 connected in series or cascade between a DC reference potential, i.e. ground/GND in the present embodiment but may be a negative DC supply rail in other embodiments, and a boost node 122. The semiconductor switch arrangement further comprises a second leg comprising third and fourth semiconductor switches Q2, Q3 connected in series or cascade between the boost node 122 and the first DC output voltage Pvdd. The first leg comprises a first intermediate node 221 placed at the junction node of the first and second semiconductor switches Q0, Q1 and the second leg likewise comprises a second intermediate node 223 placed at the junction or coupling node of the third and fourth semiconductor switches Q2, Q3. The boost inductor (LI) 111 has a first end coupled to a DC input voltage supply Vdd and a second end coupled to the boost node 122. A flying or pump capacitor C2 is coupled between the first intermediate node 221 and second intermediate node 223 such that a first end of C2 is coupled to the first intermediate node 221 and a second end coupled to the second intermediate node 223. As discussed in further detail below, the semiconductor switch arrangement comprises a first further semiconductor switch Q4, i.e. fifth switch of the present embodiment, that is configured to selectively connect and disconnect a second output node 225, supplying the second DC output voltage ½ Pvdd, to the first end of the first capacitor and hence to the first intermediate node 221. A second further semiconductor switch Q5, i.e. sixth switch of the present embodiment, is configured for selectively connecting and disconnecting the second output node 225 or, if present, a third output node to the second end of the first capacitor 212 and hence to the second intermediate node 223.

Figure 3:
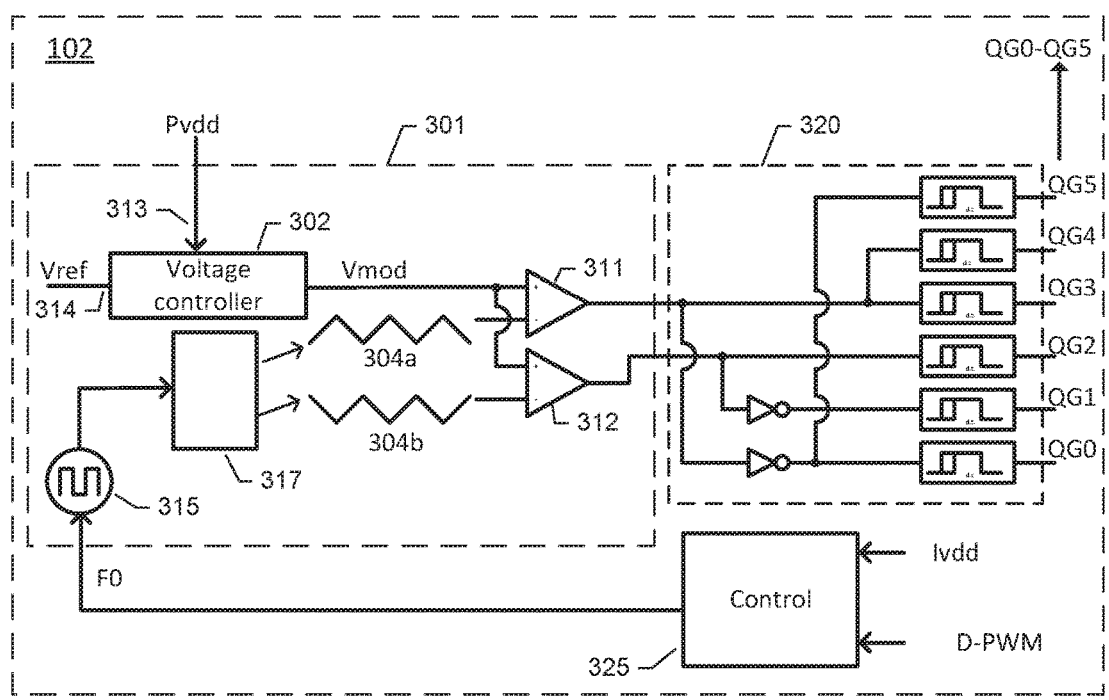
FIG. 3 illustrates schematically a control circuit of the dual-output boost DC-DC power converter depicted on FIG. 1.

FIG. 3 illustrates the previously-discussed control circuit 102 configured to adaptively adjusting the one or more operational parameters of the power converter 100 based on the detected load current, voltage or power. The control circuit 102 may be configured for switching the dual-output boost DC-DC power converter 100 between first, second and third converter states in one operational regime. The control circuit 102 comprises a pulse-width modulator 301 and a gate driver schematically shown as element 320. More details about the control circuit 102 are discussed later in the specification. The control circuit 102 is configured to generate respective gate control signals QC1-QC5 for the controllable semiconductor switches Q0-Q5 of the semiconductor switch arrangement. This feature may be utilized to control at least the switching frequency of the semiconductor switch arrangement and a duty cycle, D, of the control signals of the semiconductor switch arrangement. The feature may also be utilized for controlling state switching between different converter states etc.

The control circuit 102 is configured to selectively operate the dual-output boost DC-DC power converter 100 in at least two different operational regimes, regime 1 and regime 2, depending on the desired voltage level of the first DC output voltage. Each operational regime comprises a particular set of converter states and an associated state switching scheme. The converter state switching is controlled by the control circuit 102 such that the respective target voltage levels of the first and second DC output voltages Pvdd and ½ Pvdd are reached and maintained during operation of the power converter 100.

The operation regime 1 may selected by the control circuit 102 where the DC voltage level of the first DC output voltage, Pvdd, is smaller than 2 times the DC voltage level of the input voltage supply, Vdd. The operation regime 2 may selected by the control circuit 102 where the target or desired voltage of the first DC output voltage is larger than two times the DC input voltage, i.e. Pvdd>2*Vdd).

The detailed implementation and benefits of these different operation regimes of the power converter 100, their associated sets of converter states and state switching schemes are described in detail in the applicant's co-pending application PCT/EP2015/072124. Hence, these explanations will not be repeated in every detail here.

Figure 4A:
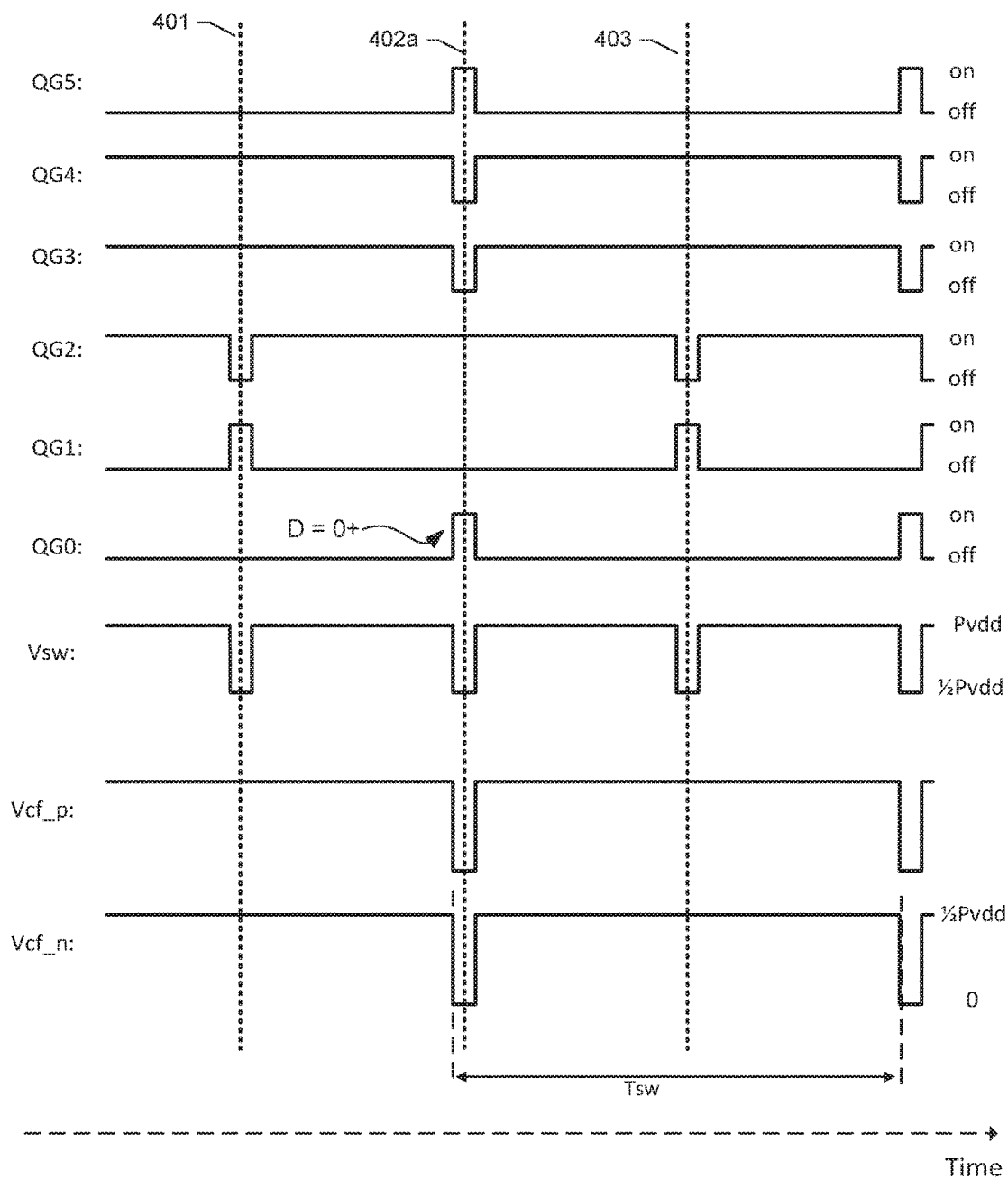
FIG. 4A illustrates exemplary gate control signals of the semiconductor switch arrangement provided by the control circuit of FIG. 3 for a first set of operational parameters of the dual-output boost DC-DC power converter.

FIGS. 4A-4D illustrates respective gate control signals QC1-QC5 of the first to sixth controllable semiconductor switches Q0-Q5 of the converter circuit 101 for four different sets of operational parameters of the power converter 100 selected based on detected load currents and/or detected load voltages. FIG. 4A illustrates operation regime 1 of the power converter (the case Pvdd<2*Vdd). The respective gate control signals QC1-QC5 of switches Q0-Q5 in FIGS. 4A-4D are depicted as "on" and "off", meaning that the associated switch is in a conducting state where the gate control signal is logic high or "1" and in a non-conducting state where the gate control signal is logic low or "0". Different switch types require different polarities and levels of the gate control signals QC1-QC5 in order to be "on" or "off", and thus the actual gate voltages are different for different switch types. In practical implementations of the control circuit, the illustrated logical gate control signals QC1-QC5 must accordingly be translated into gate control voltages or potentials that realize the desired on and off states. FIGS. 4A-4D are additionally illustrating the corresponding signal waveforms at the boost node Vsw (122) and at the first and second terminals Vcf_p and Vcf_n (221, 223) of the floating capacitor C2 (212). Finally, first, second and third converter states 401,402a, 403 of operation regime 1 are indicated above the signal waveforms of FIGS. 4A-4D. The control circuit 102 is responsible for selecting the four different sets of operational parameters and generating the corresponding control signal waveforms illustrated schematically on FIGS. 4A-4D in response to detected changes of the load current and/or load voltage.

The control circuit 102 comprises a voltage controller 302a configured for comparing a target DC voltage, Vref, and an instantaneous voltage of the first DC output voltage Pvdd. When the first DC output voltage drops below Vref, the control circuit 102 adjusts the modulation signal Vmod accordingly to ensure charging of the capacitors C2, C3 and C4 and the boost inductor L1. In the exemplary embodiment, the control circuit 102 provides, via a voltage controller 302, a modulation signal Vmod representing a difference between the first DC output voltage Pvdd of the power converter circuit and a DC target voltage Vref. The first DC output voltage Pvdd is applied to a first input 313 of the voltage controller 302 and the DC target voltage Vref to a second input 314 of the voltage controller 302. The generated modulation signal Vmod is applied to a pair of comparators 311 and 312. These comparators 311 and 312 are configured to compare the modulation signal Vmod with respective complementary ramp signals 304a and 304b to provide two pulse-width modulation signals to the gate driver 320. The gate driver 320 in turn generates the previously discussed gate control signals QC1-QC5 for the semiconductor switches Q0-Q5 which signals are used for switching the converter circuit between the first, second and third converter states via the semiconductor switches Q0-Q5. The present embodiment thus uses two PWM phases for providing the required gate control signals QC1-QC5. The control circuit 102 may comprise a triangular waveform circuit 317 configured for generating the complementary ramp signals 304a and 304b where the modulation frequency is set by a programmable square wave generator 315. The control circuit 102 comprises a controller 325 that inter alia is responsive to the previously discussed control inputs comprising the load current signal or indicator Ivdd and a current value of the duty cycle, D-PWM, of the control signals. The controller 325 may comprise an appropriately configured digital state machine or a programmable microprocessor executing a control program. The controller 325 is configured to adjust a modulation frequency of each of the ramp signals 304a, 304b such that the switching frequency f0 of each of the individual switches (Q0-Q5) of the semiconductor switch arrangement is adjusted in a corresponding manner via the previously discussed gate control signals QC1-QC5 of the semiconductor switches Q0-Q5. The controller 325 may adjust the switching frequency f0 by adjusting a frequency of the programmable square wave generator 315 of the control circuit 102 connected to an input of the triangular waveform circuit 317.

The skilled person will understand that the voltage controller 302 may comprise the previously discussed feedback voltage regulation loop configured for adjusting the duty cycle D of the gate control signals QC1-QC5 of the semiconductor switches Q0-Q5 up/down in an effort to maintain the voltage of Pvdd at the DC target voltage Vref. In addition, the switching frequency of the power converter 100 is independently adjustable through adjustment of the previously discussed gate control signals QC1-QC5 of the semiconductor switches Q0-Q5.

Hence, one or more of the switching frequency, the duty cycle of the switch control signals and the parameters of the feedback voltage regulation loop may be adjusted or adapted to optimize the operation of the power converter 100 to meet certain performance constraints—for example the power consumption demands of the load circuit 115. The power consumption demands of the load circuit 115 may be represented by the load current signal Ivdd or a combination of the load current signal Ivdd and the sensed voltage of Pvdd.

In one embodiment of the power converter 100, the control circuit 102 is configured to adjusting the switching frequency f0 between a lower frequency of 10 kHz or less and an upper frequency of at least 2 MHz—for example 5 or 10 MHz.

In one embodiment of the power converter 100, the control circuit 102 is configured to select a first switching frequency f1 of the semiconductor switches Q0-Q5 of the converter circuit 101 if the load power is smaller than a first power threshold and selecting a second switching frequency f2 if the load power exceeds the first power threshold—wherein f2 is higher than f1 for example at least two times higher or at least 5 times higher. If the load circuit comprises a class D audio power amplifier, the first power threshold may be situated somewhere between 0.01 W and 0.25 W for example around 0.1 W which indicates a near-idle operation of the class D power amplifier. The control circuit 102 may for example set the first switching frequency f1 of each of the semiconductor switches Q0-Q5 to less than 25 kHz, for example 10 kHz as mentioned above, for load power levels situated below the first power threshold. The switching frequency is indicated at the Vcn_n signal waveform by a corresponding switching cycle period Tsw. The control circuit 102 may set the second switching frequency f2 to a frequency above 100 kHz or above 250 kHz. FIG. 4A illustrates schematically the respective gate control signal waveforms of the first to sixth controllable semiconductor switches Q0-Q5 of the converter circuit 101 for the first set of operational parameters of the power converter. The first set of operational parameters may be selected by the control circuit 102 if the power drawn by the load circuit 115 lies below the first power threshold. As illustrated on FIG. 4A, the duty cycle of the control signals applied to the gates of the semiconductor switches Q0-Q5 is close to zero for example below 0.1 or below 0.05. However, each time Q1 is turned on, the boost inductor 111 is charged to the second output voltage ½ Pvdd through Q4 in state 401. Thereafter, the first DC output voltage Pvdd is charged from the DC input voltage Vdd through a current path through the boost inductor 111 and Q2 and Q3 such that the first output voltage Pvdd is charged to a voltage level approximately equal to the level of the DC input voltage Vdd, i.e. a boost ratio of one.

Figure 4B:
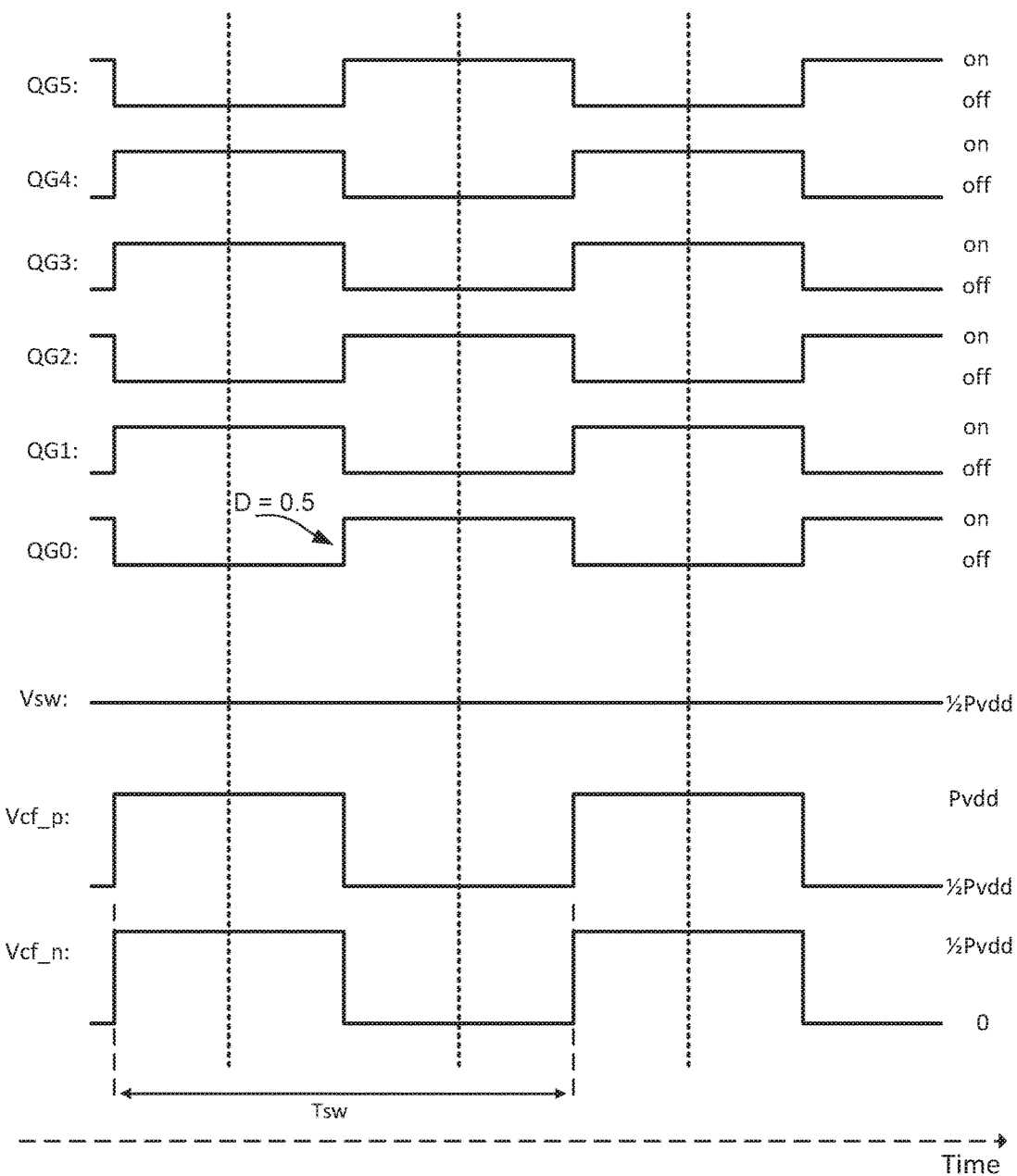
FIG. 4B illustrates exemplary gate control signals of the semiconductor switch arrangement provided by the control circuit of FIG. 3 for a second set of operational parameters of the dual-output boost DC-DC power converter.
Figure 4C:
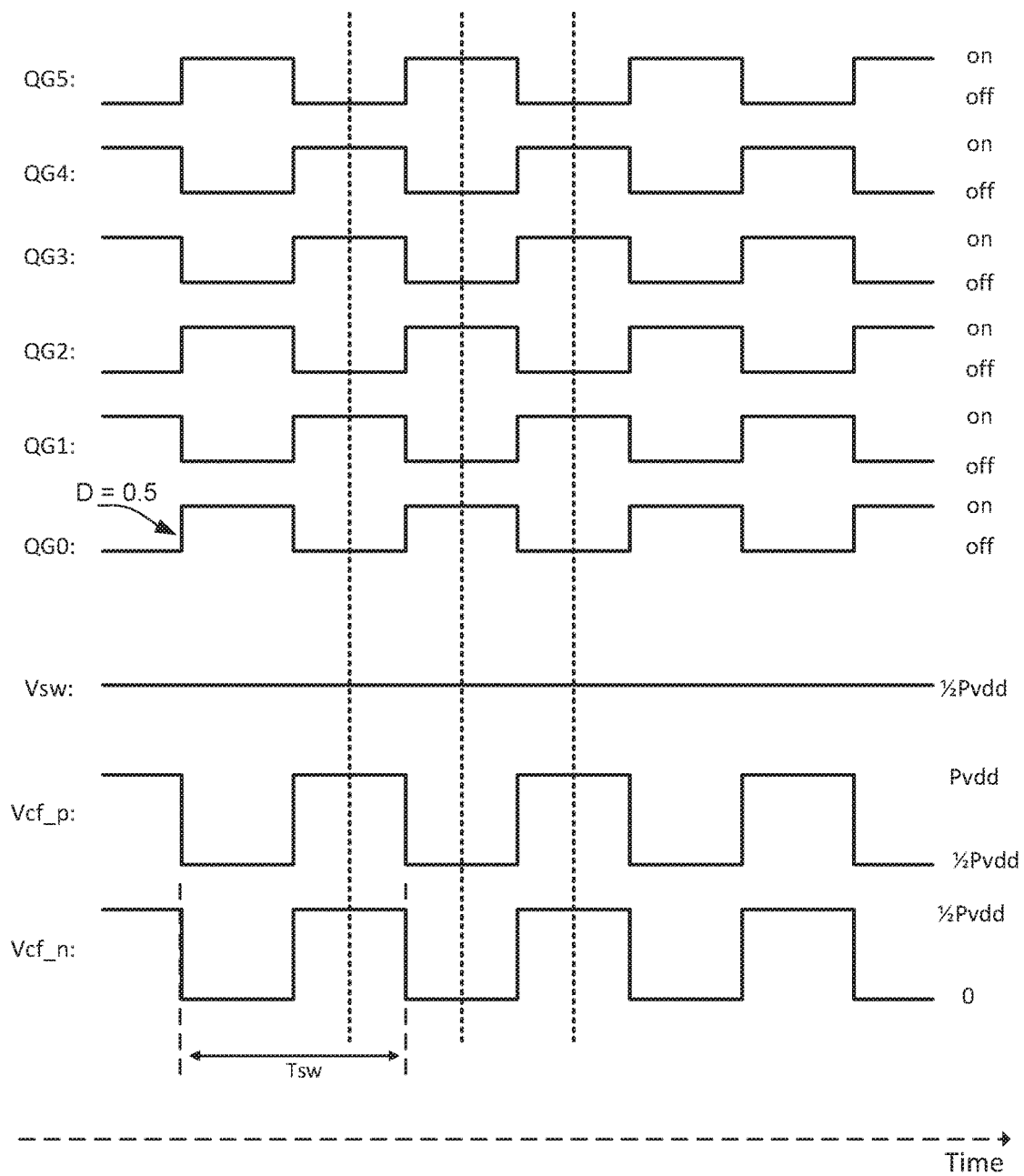
FIG. 4C illustrates exemplary gate control signals of the semiconductor switch arrangement provided by the control circuit of FIG. 3 for a third set of operational parameters of the dual-output boost DC-DC power converter.

FIG. 4B illustrates the respective gate control signals QC1-QC5 of the first to sixth controllable semiconductor switches Q0-Q5 of the converter circuit 101 for the second set of operational parameters of the power converter selected by control circuit 102 where the power drawn by the load circuit exceeds the first power threshold but remains relatively low. As illustrated on FIG. 4B, the switching frequency has been increased by the control circuit 102 to the second switching frequency f2 discussed above. The control circuit 102 has simultaneously increased the duty cycle D of each of the control signals from about zero to substantially 0.5. The latter setting of the duty cycle D forces the first DC output voltage Pvdd to approximately two times the DC input voltage Vdd. This feature is particularly advantageous for embodiments of the boost DC-DC power converter which possess an uneven number of separate DC output voltages because D=0.5 for these converter embodiments or topologies lead to a cancellation of ripple current in the boost inductor 111. The cancellation of the ripple current in the boost inductor 111 in turn leads to a very small power loss in the boost power converter 100 because the latter largely acts as a charge pump by the switching action of the floating capacitor 212. The floating capacitor 212 may be charged through the boost inductor 111 in one converter state and dump its accumulated charge to the smoothing capacitor 114, connected to the first DC output voltage, in another converter state. Hence, the boost operation of the power converter 100 is largely disabled for this 0.5 setting of the operational parameter duty cycle D. In some embodiments, the control circuit 102 may be configured to maintain D=0.5 setting throughout a relatively large range of load powers. The control circuit 102 may for example select and maintain the D=0.5 setting for low power and medium power consumption of the load circuit 115 and gradually, or stepwise, increase the switching frequency of the semiconductor switch arrangement from the first frequency, e.g. 10 kHz, or the second frequency f2 or even higher frequency to meet increasing load power demands. This is schematically illustrated by the gate control signals QC1-QC5 of the first to sixth controllable semiconductor switches Q0-Q5 of the converter circuit 101 depicted on FIG. 4C for the third set of operational parameters of the power converter selected by the control circuit 102. The control circuit 102 has increased the switching frequency of the semiconductor switch arrangement from second frequency f2 to a higher frequency for example at least two times higher. However, the duty cycle D=0.5 has been maintained to keep benefiting from the previously discussed advantages of this D setting. The skilled person will appreciate that the increase of switching frequency of the semiconductor switch arrangement from the second to the third set of operational parameters improves the power delivery capability of the power converter 100, because the output impedance of a charge pump circuit varies inversely with the switching frequency. Hence, the increasing switching frequency of the semiconductor switch arrangement for increasing load power demands improves the power delivery capability of the present power converter circuit in an advantageous manner.

Figure 4D:
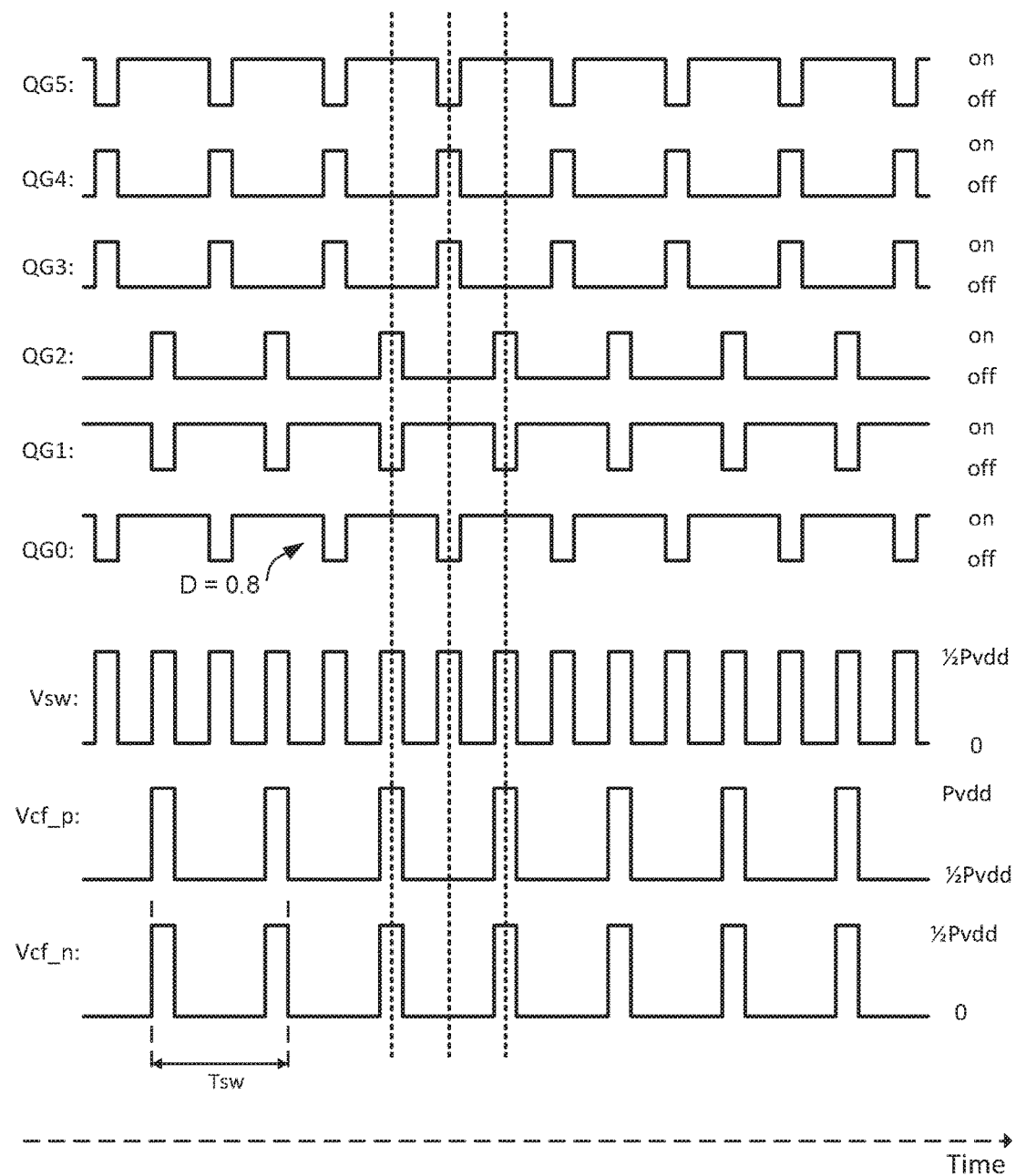
FIG. 4D illustrates exemplary gate control signals of the semiconductor switch arrangement provided by the control circuit of FIG. 3 for a fourth set of operational parameters of the dual-output boost DC-DC power converter.

FIG. 4D illustrates the respective gate control signals QC1-QC5 of the first to sixth controllable semiconductor switches Q0-Q5 of the converter circuit 101 for the fourth set of operational parameters of the power converter 100 selected by the control circuit 102. The fourth set of operational parameters is preferably selected to reach the maximum power deliver capability of the power converter 100 as per the requirement of the load circuit 115. The control circuit 102 may be configured to select the fourth set of operational parameters in response to the detected load power or current reaches more than 50% or 75% of the maximum power or current capability. As schematically illustrated by the signal waveforms of FIG. 4D, the switching frequency has been increased by the control circuit 102 relative to the switching frequency selected for the third set of operational parameters discussed above. The control circuit 102 has in addition increased the duty cycle D of each of the control signals from substantially 0.5 to about 0.8. The latter setting of the duty cycle D forces the first DC output voltage Pvdd to a higher level than two times the DC input voltage Vdd by virtue of the boost operation of the boost coil 111. The relationship between the duty cycle D and the level of the first DC output voltage Pvdd, expressed as a boost ratio relative to the DC input voltage Vdd, is depicted on curve 705 of FIG. 7A for the power converter 100. A duty cycle D=0.8 generates a level or voltage of the first DC output voltage Pvdd which approximately 5 times the level of the DC input voltage Vdd as evident from curve 705.

Hence, the control circuit 102 of the present embodiment of the power converter 100 is configured to independently adjust two different operational parameters, the duty cycle D and the switching frequency f0 in response to the switching from one set of operational parameters to another in response to changing load power demands. The skilled person will appreciate that the control circuit 102 of other embodiments of the present power converter may be configured to adjust merely a single operational parameter in response to changing load power demands while yet other embodiments may be configured to adjust three or more operational parameters in response to the changing load power demands.

The first operational parameter may be the switching frequency f0 and the second operational parameter may comprise the previously discussed parameter or state of the feedback voltage regulating loop. The first or second operational parameter may alternatively comprise the previously discussed operation regime of the power converter circuit. The control circuit 102 may be configured to switch the converter circuit 101 from operation regime 1 to operation regime 2 if the target voltage of the first DC output voltage is at least two times larger than the DC input voltage Vdd. The control circuit 102 may be configured to adjust the value of the first DC output voltage Pvdd by adjusting the DC target voltage Vref. This may for example be accomplished by using a switch matrix to switch between several different DC voltage sources. In a digital implementation of the control circuit 102, a digital-to-analog converter may be used to generate a desired voltage level of the DC target voltage Vref from a single preset DC reference voltage of the control circuit 102.

The skilled person will appreciate control circuit 102 may be configured to adjust the switching frequency f0 of the semiconductor switch arrangement between the lower and upper frequencies in a plurality of predetermined steps, for example two, three or four steps, in response to increasing levels of load power. According to one such embodiment, the control circuit 102 adjusts the switching frequency in steps from 10 kHz for near-idle operation as schematically indicated on FIG. 4A through 100 kHz, 500 kHz and finally 2 MHz as schematically indicated on FIGS. 4B, 4C and 4D, respectively, with increasing load power. Alternatively, the control circuit 102 may be configured to adjust the switching frequency f0 in a largely continuous manner in response to detected changes of the load power.

According to yet another embodiment of the power converter 100, the control circuit 102 is configured to adjust voltage levels of the control signals QC0-QC5 of the semiconductor switches of the converter circuit 101 in accordance with current load power demands. Hence, the respective voltage levels of the control signals QC0-QC5 is yet another operational parameters of the power converter 100 that may be controlled or adjusted by the control circuit 102. The control circuit 102 may be configured to select a higher voltage level of the controls signals at high load power than at small load power. The voltage of the control signals QC0-QC5 may be set to a first level for load power levels below the first power threshold which in turn may correspond to the idle and near-idle operation of the class D amplifier load circuit discussed above. When the load power level exceeds the first power threshold, the voltage of each of the control signals may be increased to second level which is markedly larger than the first level, e.g. 1, 3 or 5 volts higher. This operational parameter exploits that the equivalent on-resistance of a semiconductor switch, e.g. a MOSFET, scales inversely with the level of the applied gate control voltage, e.g. gate-to-source voltage for MOSFETs. In this manner, a higher gate to source voltage leads to decreasing on-resistance of the MOSFET switch in questions. However, the amount of energy supplied from control circuit 102 to turn-on the semiconductor switch or switches increases with increasing control voltage. The inventors have realized that in near-idle operation, where the energy required to turn on the semiconductor switches is significant and power loss due to semiconductor switch on-resistance on the contrary is insignificant, overall power conversion efficiency of the power converter can be increased when the control circuit 102 selects a small voltage level of the control signals. Conversely, when load power supplied by the power converter circuit is high, e.g. exceeds the first power threshold discussed above, the control circuit 102 may increase the overall power conversion efficiency by increasing the voltage levels of the control signals QC0-QC5 because of the smaller on-resistances of the semiconductor switches Q0-Q5 of the switch arrangement 101.

Figure 5:
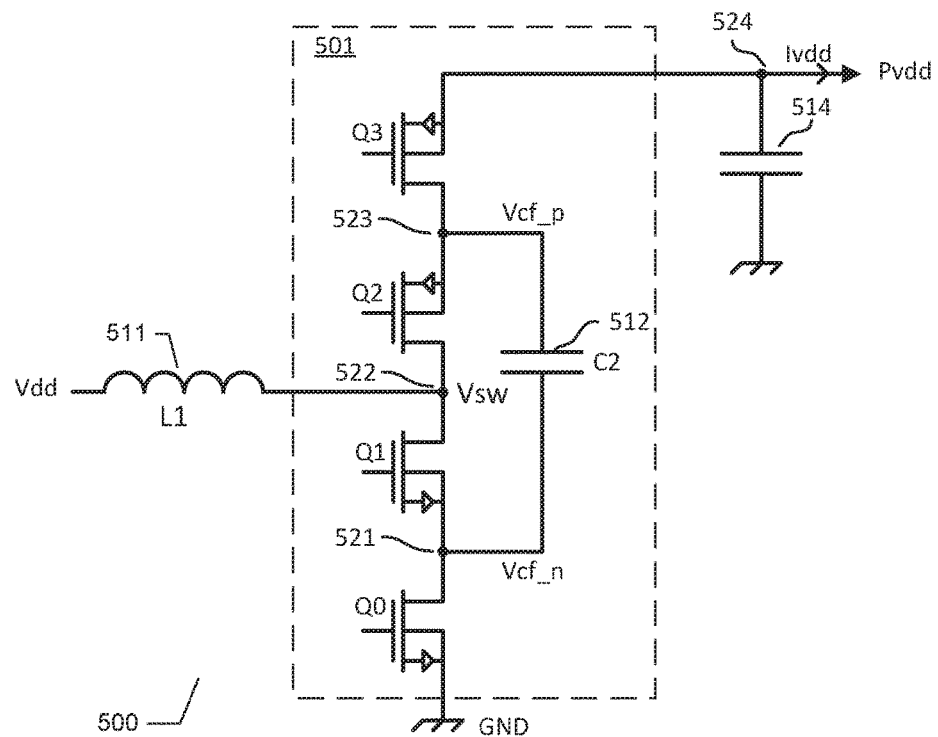
FIG. 5 is a simplified block diagram of an exemplary single-output boost DC-DC power converter in accordance with a second embodiment of the invention.
Figure 5:
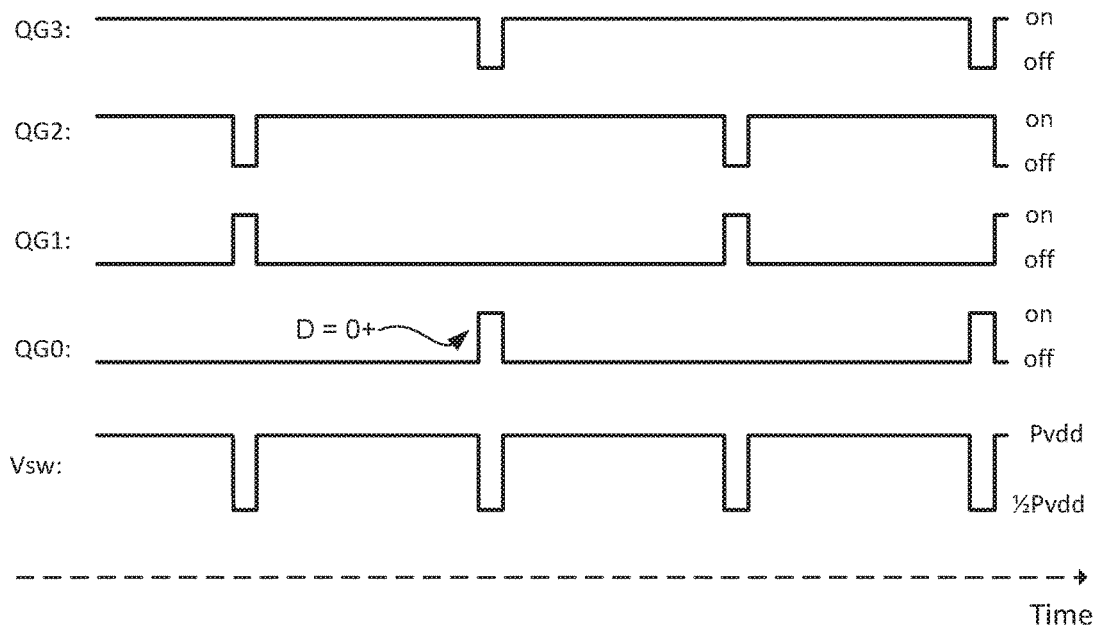

FIG. 5 illustrates a transistor level diagram of a converter circuit 501 comprising a second semiconductor switch arrangement suitable for single-output boost DC-DC power converter embodiments of the invention. The present DC-DC power converter 500 generates only a single DC output voltage Pvdd for energizing a suitable load circuit via its DC power supply rail. The load circuit may comprise a class D audio amplifier or class AB audio amplifier etc. The second semiconductor switch arrangement comprises a cascade of four controllable semiconductor switches Q0-Q3 which may be identical to the corresponding switches of the first semiconductor switch arrangement of the previously discussed converter circuit 101. In one embodiment of the power converter 500, a control circuit (not shown) is configured to select an operation regime of the semiconductor switch arrangement 501 wherein the semiconductor switches Q2 and Q3 of the second leg are placed in respective conducting states. The residual switches Q0 and Q1 are arranged in respective non-conducting states. Hence, opening a static electrically conducting path from the DC input voltage supply Vdd to the first DC output voltage Pvdd to energize the latter without providing any boost of the Vdd. This operation regime of the semiconductor switch arrangement may be selected by the control circuit when the load power is relatively small—for example corresponding to near-idle operation of a class D power amplifier load (not shown). The respective control signal waveforms QC1-QC3 applied to the gate terminals of the four controllable semiconductor switches Q0-Q3 are plotted below the circuit schematic for a single set of operational parameters the single-output boost DC-DC converter 500. This set of operational parameters may correspond to the first set of operational parameters discussed above in connection with the dual-output boost DC-DC converter 100 and FIG. 4A, i.e. applicable where the load power is relatively small. As discussed in detail in connection with the previous dual-output boost DC-DC converter 100, the control circuit of the present single-output boost DC-DC converter 500 may be configured to adjust one or more operational parameters of the power converter 500 in response to changing load current, voltage or power demands to adapt electrical properties, such as conversion efficiency, of the power converter 500 to the required load power in a corresponding manner to the one discussed above in detail in respect of the dual-output boost DC-DC converter 100.

Figure 6:
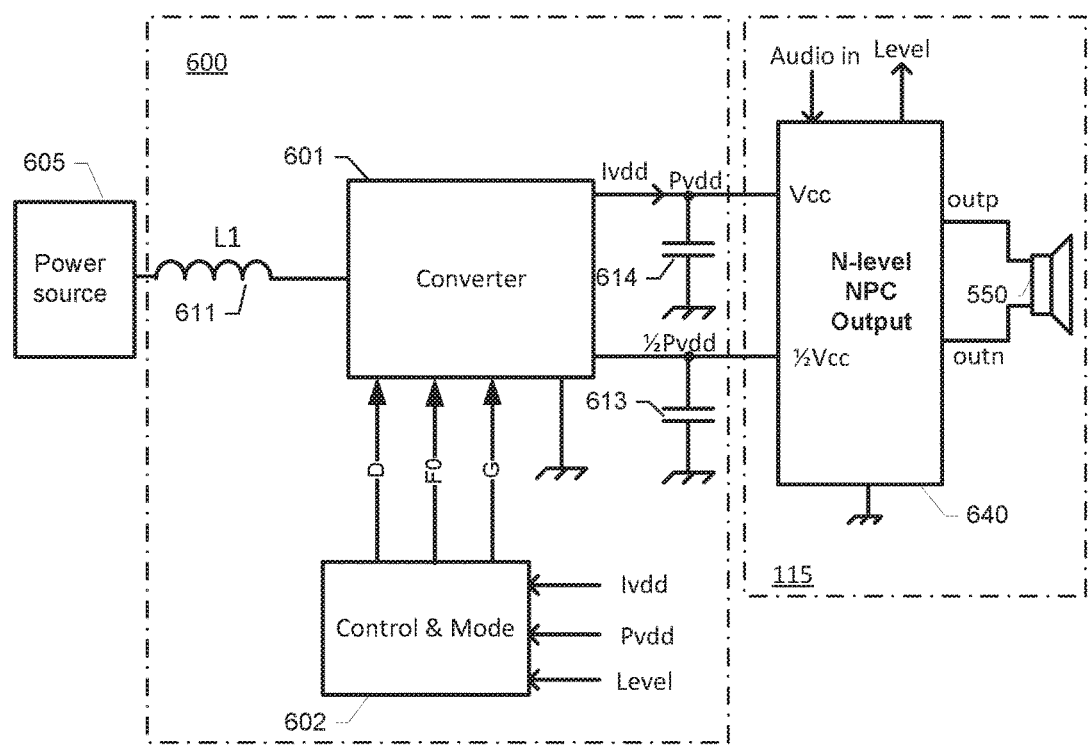
FIG. 6 is a block diagram of an audio amplification system comprising a dual-output boost DC-DC power converter in accordance with various embodiments of the invention connected to a load circuit comprising a Class D audio amplifier.

FIG. 6 is a schematic block diagram of an audio amplification system comprising a dual-output boost DC-DC power converter 600 in accordance with one of the previously described embodiments thereof connected to a Class D audio amplifier 640. The skilled person will appreciate that the dual-output boost DC-DC power converter 600 may be identical to any of the above-discussed dual-output voltage power converters 100. The class D audio amplifier 640 has a first (GND) voltage supply rail coupled to the ground connection of the power converter 600. A second voltage supply rail Vcc of the class D audio amplifier 640 is coupled to the first or upper DC output voltage Pvdd of the power converter 600. The class D audio amplifier 640 additionally comprises a mid-supply voltage supply rail ½ Vcc which is connected to the second or lower DC output voltage ½ Pvdd of the power converter 600. The Class D audio amplifier 640 comprises a pair of speaker output terminals or pads connectable to a loudspeaker 550 which may comprise a miniature electrodynamic speaker of a portable communication terminal or device or a regular sized loudspeaker for domestic applications. The control circuit 602 is configured to monitor or detect the load current Ivdd, drawn by the class D audio amplifier 640 from the first DC output voltage Pvdd, and/or the upper DC output voltage Pvdd supplied to the class D audio amplifier. The control circuit 602 is configured to adjusting one or more operational parameters of the boost DC-DC power converter 600 as discussed above based on the detected load current, and optionally the load voltage represented by the upper DC output voltage Pvdd or the lower DC output voltage ½ Pvdd.

The class D audio amplifier 640 comprises an audio level detector (not shown) configured to determine a level of an audio input signal, or an audio signal derived therefrom, of the class D audio amplifier 640. The audio level detector may be configured to directly measure or detect a level of the audio signal at the input (Audio in), or at the output (outp-outn), of the audio amplifier 640. The audio level detector may be configured to determine the level of the audio input signal in an indirect manner by detecting a modulation index of a pulse width modulated signal generated inside the audio amplifier 640, e.g. generated by a pulse width modulator of the amplifier 640. The level of the audio signal may be expressed relative to a known maximum audio level input or a known maximum audio level output at the output terminals connected to the loudspeaker load 550. The class D audio amplifier 640 comprises a likewise optional audio level indicator (Level) configured to indicate the determined level of the audio input signal or audio signal derived therefrom for example on an externally accessible pad or terminal of the class D audio amplifier 640. The audio level indicator (Level) may be connected to an input of the control circuit 602 such that the latter is configured to adjusting the one or more operational parameters of the boost DC-DC power converter 600 as discussed above based on the detected audio signal level. This feature allows the boost DC-DC power converter 600 to adjust the upper and lower DC output voltages such that these are tracking the level of the audio signal. In this manner, the upper and lower DC output voltages may both be set to lower voltages at small levels of the audio signal than at large levels of the audio signal, i.e. an adjustment of the upper and lower DC output voltages. This has the advantage that various parasitic switching losses in the class D audio amplifier assoviaed with state switching of semiconductor devices, in particular semiconductor devices of an output stage, are reduced at small levels of the audio signal.

Figure 7:
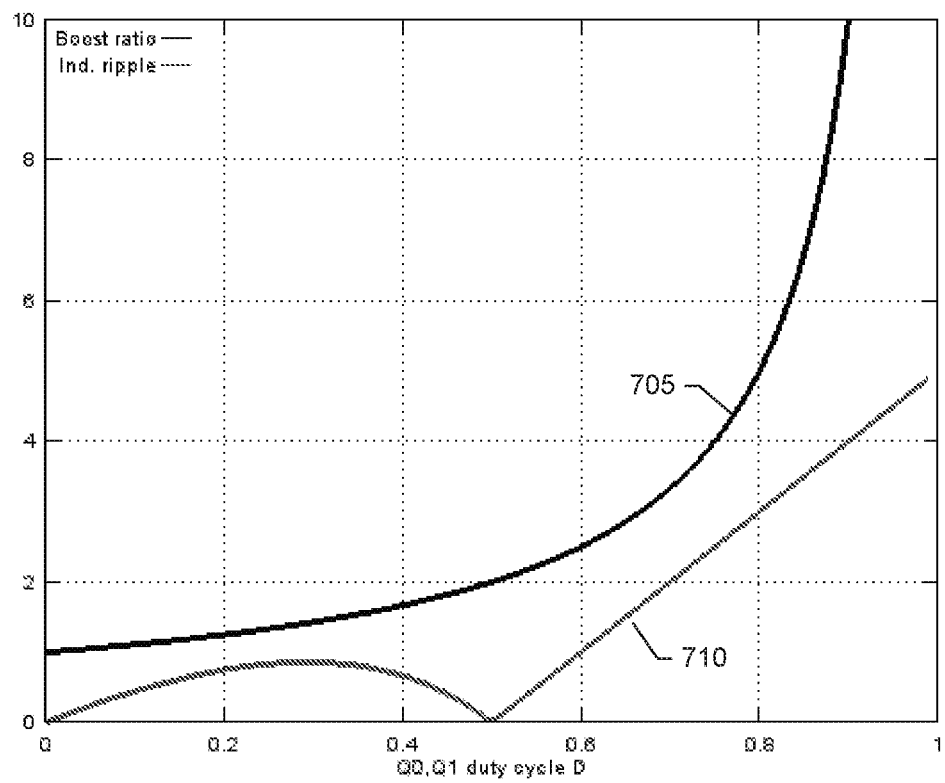
FIG. 7 shows a graph depicting computed duty cycle D versus boost ratio of an exemplary dual-output boost DC-DC power converter.

Curve 710 of FIG. 7 shows a computed relationship between the duty cycle D of the control signals of the semiconductor switch arrangement of the converter circuit and the ripple current magnitude running in the boost coil L1 of the previously discussed the dual-output DC power converter 100. It is evident from curve 710 that the duty cycle D=0.5 produces a distinct local minimum in the ripple current magnitude as previously discussed. This D setting minimizes the power loss associated with drawing current through the boost coil in a beneficial manner.

The invention claimed is:

1. A boost DC-DC power converter comprising a semiconductor switch arrangement comprising:
   a first leg comprising N series connected semiconductor switches, where N is an integer larger than 1, where a first end of the first leg is connected to a DC reference potential, a second end of the first leg is connected to a boost node,
   a second leg comprising N series connected semiconductor switches, a first end of the second leg being connected to the boost node and a second end of the second leg being connected to a first output node for supplying a first DC output voltage;
   an inductor having a first end connected to the boost node and a second end connectable to a DC input voltage supply,
   a first capacitor connected between a first intermediate node of the first leg and a second intermediate node of the second leg,
   a second capacitor connected between the DC reference potential and the first output node;
   a first further semiconductor switch for selectively coupling or decoupling a second output node to a first end of the first capacitor, for supplying a second DC output voltage via the second output node,
   a second further semiconductor switch for selectively coupling or decoupling the second output node or, if present, a third output node, to a second end of the first capacitor;
   a load sensor configured to detect at least one of a load current and a load voltage of a load circuit, said load circuit being connectable to at least the first DC output voltage; and
   a control circuit connected to respective control terminals of the semiconductor switches of the semiconductor switch arrangement, the control circuit being further configured to adjust one or more operational parameters of the boost DC-DC power converter based on the at least one of the detected load current and load voltage.

2. The boost DC-DC power converter of claim 1, wherein the one or more operational parameters comprises at least one of:
   a switching frequency of the semiconductor switches of the semiconductor switch arrangement;
   a duty cycle, D, of the control signals of the semiconductor switches of the semiconductor switch arrangement;
   a voltage level of the control signals of the semiconductor switches of the semiconductor switch arrangement;
   an operational regime of the semiconductor switch arrangement, wherein said operational regime comprises a predetermined set of converter states; and
   a parameter of a feedback regulating loop controlling a DC voltage level of at least the first DC output voltage.

3. The boost DC-DC power converter of claim 2, wherein the control circuit is configured to:
   select an operational regime of the semiconductor switch arrangement wherein the N series connected semiconductor switches of the second leg are placed in respective conducting states and the semiconductor switches of the first leg are arranged in respective non-conducting states,
   thereby energizing the first DC output voltage from the DC input voltage supply through the second leg.

4. The boost DC-DC power converter of claim 1, wherein the load current comprises a DC or AC current flowing through a power supply line of the load circuit and the load voltage comprises a DC or AC voltage of the power supply line of the load circuit.

5. The boost DC-DC power converter of claim 1, wherein the load current comprises a DC or AC current flowing through at least the first DC output voltage and the load voltage comprises a DC or AC voltage of at least the first DC output voltage.

6. The boost DC-DC power converter of claim 2, wherein the predetermined set of converter states of at least one operational regime comprises:
   a first charge configuration for charging the inductor through a first current path extending from the boost node to the DC reference potential; and
   a first discharge configuration for discharging the inductor through a second current path extending from the boost node either directly through the second leg to the first output node or through the first capacitor and at least one semiconductor switch of the first leg and one semiconductor switch of the second leg.

7. The boost DC-DC power converter of claim 6, wherein the control circuit is further configured to set the duty cycle of each of the control signals of the semiconductor switches of the semiconductor switch arrangement to 0.5.

8. The boost DC-DC power converter of claim 6, wherein the control circuit is further configured to:
   detecting load power to the load circuit based at least on the detected load current; and
   adjusting the switching frequency of the semiconductor switch arrangement in accordance with the detected load power.

9. The boost DC-DC power converter of claim 8, wherein the control circuit is further configured to:
   selecting a first switching frequency if the load power is smaller than a first power threshold; and
   selecting a second switching frequency if the load power exceeds the first power threshold, wherein the second switching frequency is higher than the first switching frequency.

10. The boost DC-DC power converter of claim 2, wherein the control circuit is further configured to:
    detecting load power to the load circuit based at least on the detected load current; and
    adjusting a loop gain of the feedback regulation loop in accordance with the detected load power.

11. The boost DC-DC power converter of claim 10, wherein the control circuit is configured to:
  selecting a first loop gain if the detected load power is below a first power threshold;
  selecting a second loop gain if the detected load power exceeds the first power threshold; wherein the first loop gain is smaller than the second loop gain.

12. An audio amplification system comprising the boost DC-DC power converter of claim 1 and an audio power amplifier; said audio power amplifier comprising at least a first DC supply voltage rail connected to the DC reference potential of the boost DC-DC power converter and a second DC supply voltage rail coupled to the first DC output voltage of the boost DC-DC power converter.

13. The audio amplification system of claim 12, wherein the audio power amplifier comprises a class D audio amplifier such as multilevel class D audio amplifier.

14. The audio amplification system of claim 13, wherein the class D audio amplifier comprises:
  an audio level detector configured to determine a level of an audio input signal, or an audio signal derived therefrom, of the class D audio amplifier;
  an audio level indicator configured to indicate the determined level of the audio input signal or audio signal derived therefrom.

15. The boost DC-DC power converter of claim 3, wherein the predetermined set of converter states of at least one operational regime comprises:
  a first charge configuration for charging the inductor through a first current path extending from the boost node to the DC reference potential; and
  a first discharge configuration for discharging the inductor through a second current path extending from the boost node either directly through the second leg to the first output node or through the first capacitor and at least one semiconductor switch of the first leg and one semiconductor switch of the second leg.

16. The boost DC-DC power converter of claim 4, wherein the predetermined set of converter states of at least one operational regime comprises:
  a first charge configuration for charging the inductor through a first current path extending from the boost node to the DC reference potential; and
  a first discharge configuration for discharging the inductor through a second current path extending from the boost node either directly through the second leg to the first output node or through the first capacitor and at least one semiconductor switch of the first leg and one semiconductor switch of the second leg.

17. The boost DC-DC power converter of claim 5, wherein the predetermined set of converter states of at least one operational regime comprises:
  a first charge configuration for charging the inductor through a first current path extending from the boost node to the DC reference potential; and
  a first discharge configuration for discharging the inductor through a second current path extending from the boost node either directly through the second leg to the first output node or through the first capacitor and at least one semiconductor switch of the first leg and one semiconductor switch of the second leg.

18. A boost DC-DC power converter comprising a semiconductor switch arrangement comprising:
  a first leg comprising N series connected semiconductor switches, where N is an integer larger than 1, where a first end of the first leg is connected to a DC reference potential and a second end of the first leg is connected to a boost node;
  a second leg comprising N series connected semiconductor switches, a first end of the second leg being connected to the boost node and a second end of the second leg being connected to a first output node for supplying a first DC output voltage;
  an inductor having a first end connected to the boost node and a second end connectable to a DC input voltage supply;
  a first capacitor connected between a first intermediate node of the first leg and a second intermediate node of the second leg;
  a second capacitor connected between the DC reference potential and the first output node;
  a load sensor configured to detect at least one of a load current and a load voltage of a load circuit, said load circuit being connectable to at least the first DC output voltage; and
  a control circuit connected to respective control terminals of the semiconductor switches of the semiconductor switch arrangement, the control circuit configured to:
    detect load power to the load circuit based on at least the detected load current;
    select a first switching frequency if the detected load power is smaller than a first power threshold;
    select a second switching frequency if the detected load power exceeds the first power threshold, wherein the second switching frequency is higher than the first switching frequency; and
    switch the semiconductor switches using the selected one of the first and second switching frequencies.

19. The boost DC-DC power converter of claim 18, wherein the control circuit is further configured to adjust, based on the at least one of the detected load current and load voltage, an operational regime of the semiconductor switch arrangement, wherein said operational regime comprises a predetermined set of converter states including an operational regime comprising:
  a first charge configuration for charging the inductor through a first current path extending from the boost node to the DC reference potential; and
  a first discharge configuration for discharging the inductor through a second current path extending from the boost node either directly through the second leg to the first output node or through the first capacitor and at least one semiconductor switch of the first leg and one semiconductor switch of the second leg.

20. A boost DC-DC power converter comprising a semiconductor switch arrangement comprising:
  a first leg comprising N series connected semiconductor switches, where N is an integer larger than 1, where a first end of the first leg is connected to a DC reference potential and a second end of the first leg is connected to a boost node;
  a second leg comprising N series connected semiconductor switches, a first end of the second leg being connected to the boost node and a second end of the second leg being connected to a first output node for supplying a first DC output voltage;
  an inductor having a first end connected to the boost node and a second end connectable to a DC input voltage supply;
  a first capacitor connected between a first intermediate node of the first leg and a second intermediate node of the second leg;

a second capacitor connected between the DC reference potential and the first output node;

a load sensor configured to detect at least one of a load current and a load voltage of a load circuit, said load circuit being connectable to at least the first DC output voltage; and a control circuit connected to respective control terminals of the semiconductor switches of the semiconductor switch arrangement, the control circuit configured to detect load power to the load circuit based at least on the detected load current, and to adjust a loop gain of a feedback regulating loop controlling a DC voltage level of at least the first DC output voltage, the adjustment comprising:

selecting a first loop gain if the detected load power is below a first power threshold;

selecting a second loop gain if the detected load power exceeds the first power threshold, wherein the first loop gain is smaller than the second loop gain.

\* \* \* \* \*